United States Patent [19]

Nelson

[11] Patent Number: 4,984,358
[45] Date of Patent: Jan. 15, 1991

[54] METHOD OF ASSEMBLING STACKS OF INTEGRATED CIRCUIT DIES

[75] Inventor: Bradley H. Nelson, Austin, Tex.

[73] Assignee: Microelectronics and Computer Technology Corporation, Austin, Tex.

[21] Appl. No.: 539,769

[22] Filed: Jun. 18, 1990

Related U.S. Application Data

[63] Continuation-in-part of Ser. No. 429,293, Oct. 27, 1989, which is a continuation of Ser. No. 321,500, Mar. 10, 1989, Pat. No. 4,930,216.

[51] Int. Cl.⁵ ............................................. H05K 3/36
[52] U.S. Cl. ........................................ 29/830; 29/854; 29/885; 29/412; 29/413; 29/414; 437/226
[58] Field of Search .................. 29/830, 854, 855, 885, 29/412–415; 437/226, 227

[56] References Cited

U.S. PATENT DOCUMENTS

| | | | |
|---|---|---|---|
| 3,280,019 | 10/1966 | Harding et al. | 204/181 |
| 3,588,852 | 6/1971 | McCormack et al. | 29/830 |
| 3,835,531 | 9/1974 | Luttmer | 29/830 |
| 4,486,738 | 12/1984 | Sadlo et al. | 338/320 |
| 4,542,397 | 9/1985 | Biegelsen et al. | 357/92 |
| 4,640,721 | 2/1987 | Uehara et al. | 148/188 |
| 4,897,918 | 2/1990 | Osaka et al. | 29/830 |

FOREIGN PATENT DOCUMENTS 245099  4/1987  German Democratic Rep. ... 29/830

Primary Examiner—P. W. Echols
Attorney, Agent, or Firm—David M. Sigmond

[57] ABSTRACT

Integrated circuit dies, while still in wafer form, are prepared for stacking without requiring packaging. Holes are made through a wafer having a plurality of integrated circuit dies and are placed between the dies and adjacent the die pads. A layer of insulating material is placed on the wafer and in the outer periphery of the holes. An electrically conductive connection is made between the top of each pad and the inside of the insulating material in an adjacent hole. The insulating layer and the electrically conductive layer can be further extended to the backside of the dies if desired. The dies are separated from each other and can be assembled in a stack and/or surface mounted to a substrate.

20 Claims, 5 Drawing Sheets

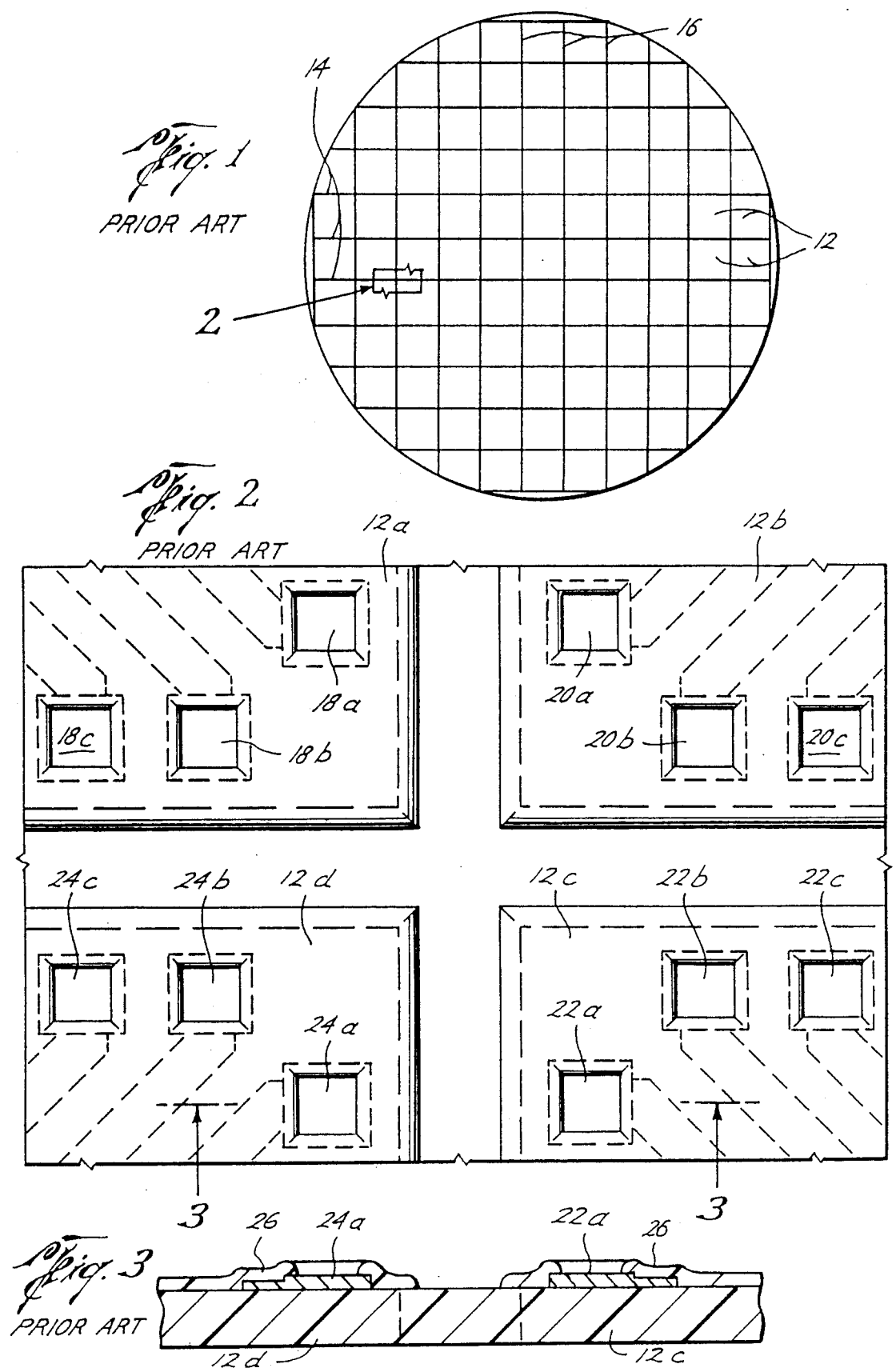

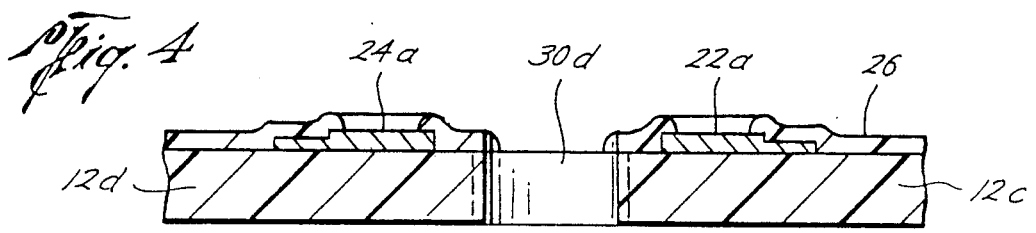
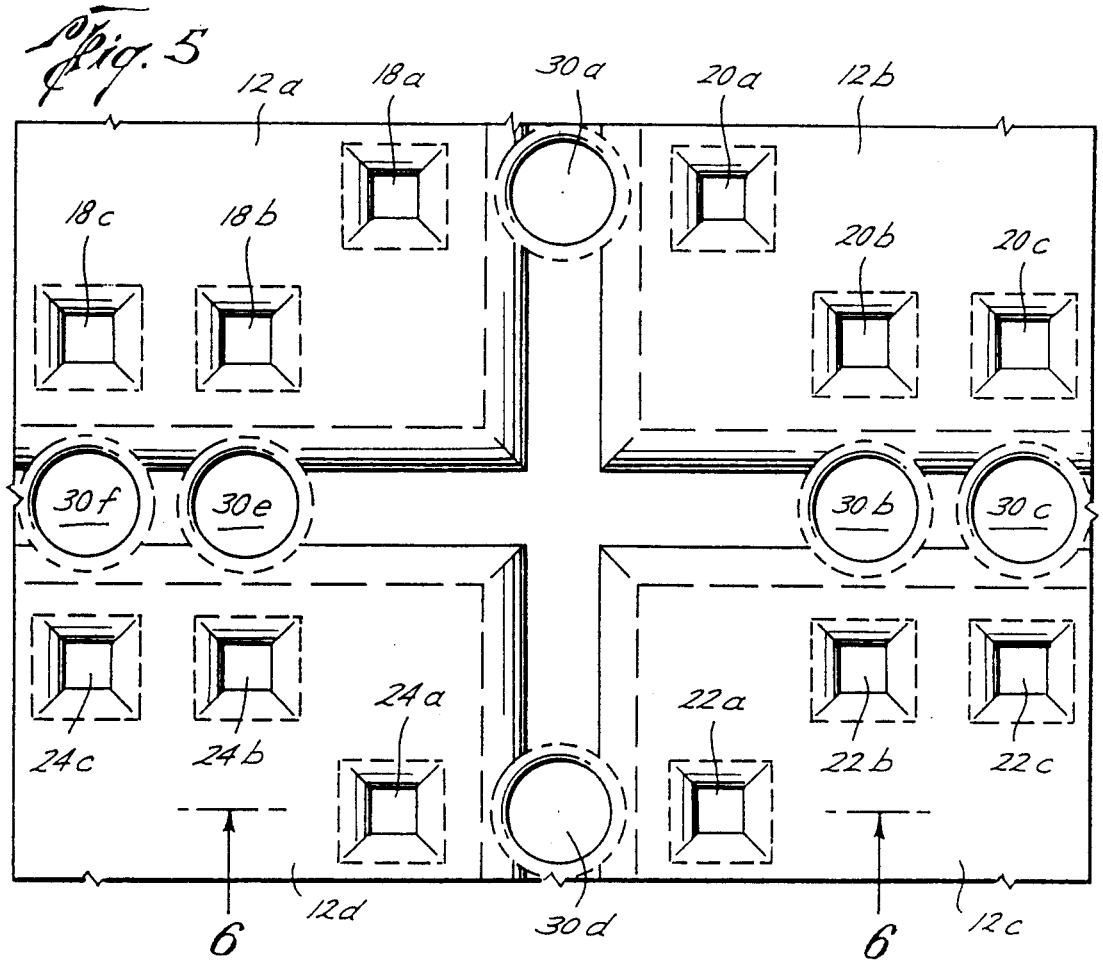
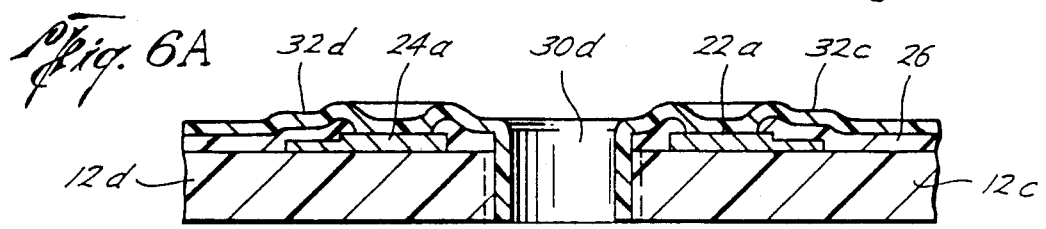
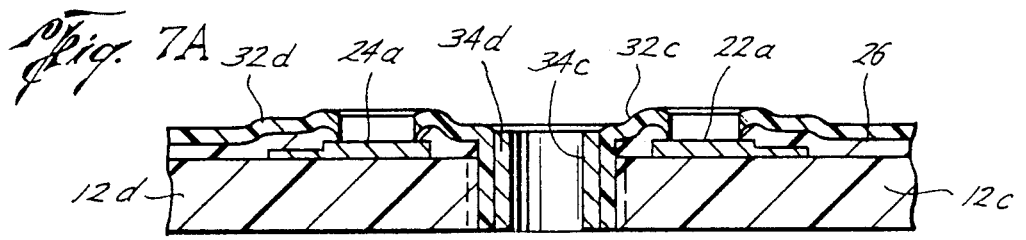

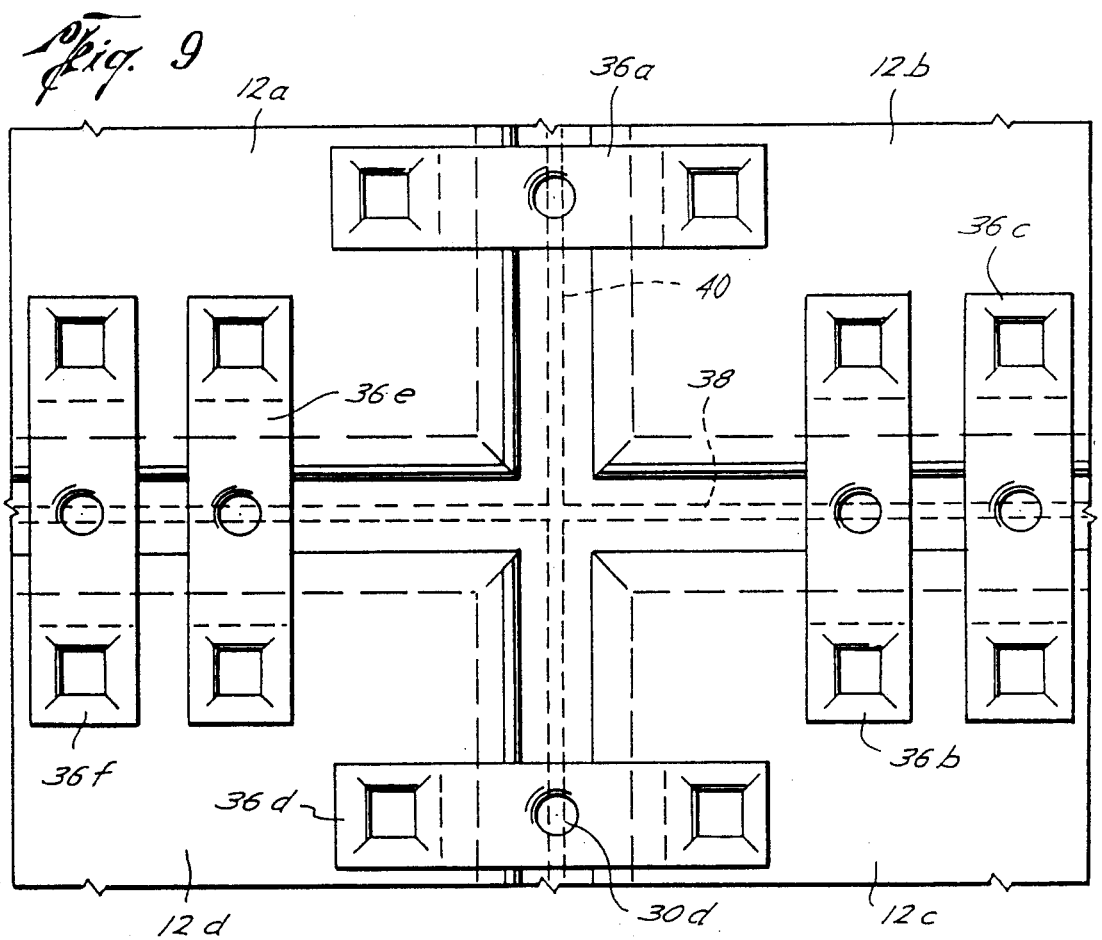
Fig. 9
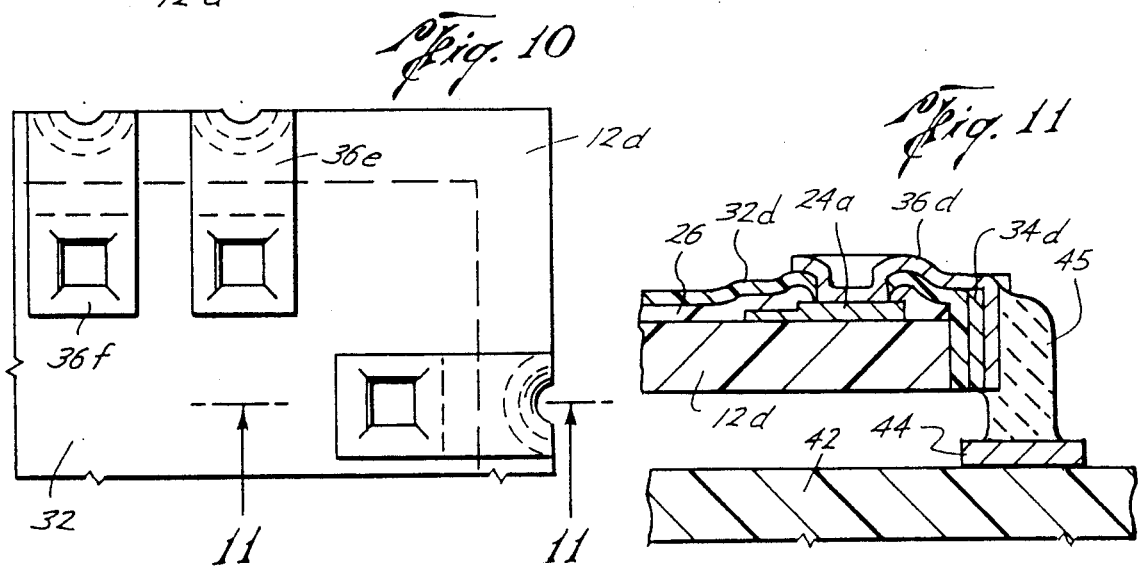
Fig. 10
Fig. 11

METHOD OF ASSEMBLING STACKS OF INTEGRATED CIRCUIT DIES

CROSS-REFERENCE TO RELATED APPLICATIONS

This application is a continuation-in-part of U.S. Ser. No. 07/429,293, filed Oct. 27, 1989, entitled "Process For Preparing Integrated Circuit Dies For Mounting," now pending, which is a continuation of U.S. Ser. No. 07/321,500, filed Mar. 10, 1989, entitled "Process For Preparing Integrated Circuit Dies For Mounting," now U.S. Pat. No. 4,930,216.

BACKGROUND OF THE INVENTION

It is known to place an integrated circuit die in a leadless ceramic package having serrated edges on the edges of the package and then solder the package to a substrate.

However, the manufacturing of packaging integrated circuits increases the complexity and expense. The present invention is directed to a method for preparing integrated circuit dies, while still in wafer form, for stacking as well as surface mounting to a substrate without requiring packaging of the dies, while still fabricating the dies in a manner to be corrosion resistant.

SUMMARY

The present invention is directed to a method of assembling stacks integrated circuit dies for mounting on a substrate, and includes making holes through a wafer having a plurality of integrated circuit dies in which the dies include bonding pads thereon connected to the integrated circuits in the dies. Holes are placed between the dies and adjacent the pads. The method includes placing a layer of insulating material over the wafer and in the outer periphery of the holes. An electrically conductive connection is patterned between the top of each bonding pad and the inside of the insulating material in an adjacent hole. The insulating layer and electrically conductive connection can also be applied beneath the dies to their backsides if desired. Thereafter, the plurality of dies are separated from each other along lines extending through the holes between the dies. This leaves the edge of the die metallized, as well as the backside of the die metallized if desired.

An object of the present invention is interconnection of dies between the electrically conductive connections on the inside of the cut holes.

Yet another object of the present invention is interconnection of the dies between the electrical conductors on the backside of a die and the pads on the top of a separate die.

Another object of the present invention is connecting a die to a substrate by an electrical interconnection to the electrically conductive connection on the inside of the cut holes.

Still another object of the present invention is wherein the holes are placed between pads on adjacent dies whereby each hole may be connected to two pads.

Yet a still further object of the present invention is wherein scribe lines are positioned on the wafer between adjacent dies and the holes are placed on the scribe lines.

A still further object of the present invention is the addition of a protective dielectric layer between a die and an interconnected component.

A further object of the present invention is a method of assembling stacks of integrated circuit dies by making holes through a wafer having a plurality of integrated circuit dies in which the dies include pads thereon connected to integrated circuits in the dies. The holes are placed between the dies and adjacent the pads. A layer of insulating material is placed over the wafer and in the outer periphery of the holes, as well as on the backside beneath the die if desired. The insulating material is then removed from the tops of the pads. An electrically conductive layer is added to the inner periphery of the insulating materials in the holes and an electrical connection is added between the top of each pad and the conductive layer in the holes, and electrical conductors connected to the conductive layer in the holes can be applied to an insulator layer beneath the die if desired. The plurality of dies are separated, such as by sawing, along the lines passing through the holes between the dies. A stack of dies car be connected together, or a die can be connected to a substrate.

Other and further objects, features and advantages will be apparent from the following description of a presently preferred embodiment of the invention, given for the purpose of disclosure, and taken in conjunction with the accompanying drawings.

BRIEF DESCRIPTION OF THE DRAWINGS

FIG. 1 is an elevational view of a conventional wafer having a plurality of integrated circuit dies, FIG. 2 is an enlarged elevational view of the intersection 2 of FIG. 1, FIG. 3 is a cross-sectional view taken along the line 3—3 of FIG. 2, FIG. 4 is a view similar to FIG. 3 with the addition of the steps of providing holes through the wafer between adjacent dies, FIG. 5 is an elevational view of the structure of FIG. 4 with the addition of an insulating layer over the wafer and on the inside periphery of the holes, FIGS. 6A and 6B are cross-sectional views taken along the line 6—6 of FIG. 5, FIGS. 7A and 7B are views similar to FIGS. 6A and 6B showing the step of removing the insulation from the top of the bonding pads on the dies and with the addition of a electrical conductor layer on the inside circumference of the holes, FIG. 9 is an elevational view of the structure of FIG. 8 and also indicating cutting lines between adjacent dies along which the dies are separated, FIG. 10 is a fragmentary elevational view illustrating one of the dies of FIG. 9 which has been separated from the wafer, and FIG. 11 is a cross-section taken along the line 11—11 of FIG. 10 with the addition of a soldering connection between, the die and a substrate.

DESCRIPTION OF THE PREFERRED EMBODIMENT

Figure 8A:
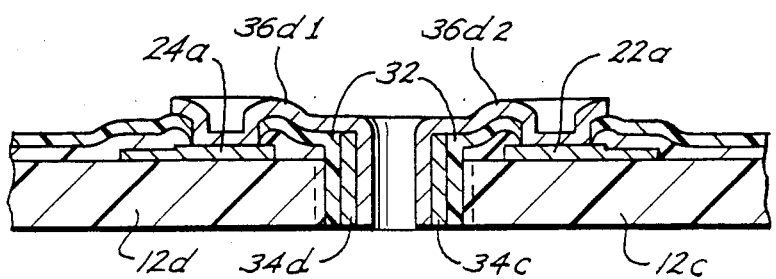
FIGS. 8A and 8B are views similar to FIGS. 7A and 7B with the addition of an electrical connection between the pads and the conductive layer on the inside circumference of the holes.

Referring now to the drawings, the reference numeral 10 generally indicates a conventional wafer, such as a silicon wafer, having a plurality of integrated circuit dies 12 thereon and conventional scribe lines 14 and 16 thereon between adjacent dies 12 along which the wafer 10 is conventionally sawed for separating the dies 12.

Referring now to FIGS. 2 and 3, an enlarged plan view and section view of a portion of the wafer 10 is shown in which the individual dies are numbered 12a, 12b, 12c and 12d for convenience. As is conventional, each of the dies includes a plurality of bonding pads which are connected to the integrated circuits for providing for connection of the dies to other components. For example, die 12a includes a plurality of bonding pads 18a, 18b, and 18c. Die 12b includes a plurality of bonding pads 20a, 20b, and 20c. Die 12c includes a plurality of bonding pads 22a, 22b and 22c, and die 12d includes a plurality of bonding pads 24a, 24b and 24c. As is conventional, an insulating layer 26 is provided over the dies 12. The bonding pads are generally metallic such as aluminum.

The above description of a wafer 10 and its components is conventional. Normally, the wafer 10 is sawed along the scribe lines 14 and 16 separating the individual integrated circuit dies 12 from each other and they can be encapsulated in a package having serrated edges for soldering the package to a substrate, which is expensive.

The present invention is directed to a method for preparing the integrated circuit dies, while still in wafer form for stacking as well as surface mounting direct to a substrate without requiring an expensive package.

Referring now to FIGS. 4 and 5, a plurality of holes, for example 5 mil diameter holes, are made through the wafer 10 between the dies 12 and adjacent the bonding pads. The holes may be made by any suitable means such as etching, or ultra-sonic drilling. Preferably, the holes are made on the scribe lines 14 and 16, and where possible between adjacent pads on adjacent dies for allowing each hole to be connected to two pads as will be more fully described hereinafter.

Figure 6B:
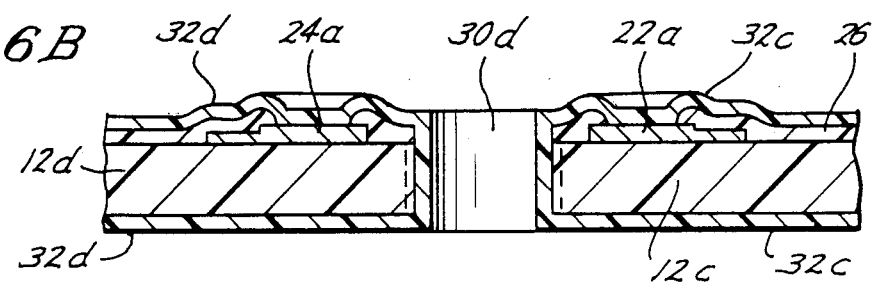

Referring now to FIGS. 6A and 6B, hole 30a may be made through the wafer 10 between dies 12a and 12b between pads 18a and 20a. Hole 30b is between dies 12b and 12c between pads 20b and 22b, hole 30c is between dies 12b and 12c between pads 20c and 22c, hole 30d is between dies 12c and 12d between pads 24a and 22a, hole 30e is between dies 12a and 12d between pads 18b and 24b, and hole 30f is between dies 12a and 12d between pads 18c and 24c. A layer of insulating material 32 seen as 32c for die 12c and 32d for die 12d, such as silicon oxide or silicon nitride, is applied over the wafer 10 and in the outer periphery of but not filling the holes, such as by the process of chemical vapor deposition. Alternatively, as seen in FIG. 6B, insulating material 32 can also be applied beneath wafer 10 along its backside, in the same step if desired. A preferred thickness of insulating material 32 is 1-2 microns.

Hermetic sealing considerations often play an important role in wafer manufacturing. In accordance with the present invention, silicon nitride will provide a better hermetically sealing insulator 32 than silicon oxide. However, a still better hermetic seal by insulator 32 is acheived by first applying a layer of silicon oxide, for instance 0.5 micron, and then applying a layer of silicon nitride, for instance 0.5 micron. While the two separate layers each tend to form pinholes, the pinholes form in different locations, and the likelihood of aligning pinholes is small. Thus the pinholes are likely to be plugged. A tight hermetic seal can also be formed by covering insulator material 32, preferably silicon nitride, with an organic dielectric such as Parylene. Parylene is a conformal polymer coating which uniformly protects various configurations of parts, such as sharp edges and points. Parylene is the generic name for members of a unique polymer series developed by Union Carbide Corporation. A parylene coating of 0.1 to 76 microns can be applied in a single operation.

Figure 7B:
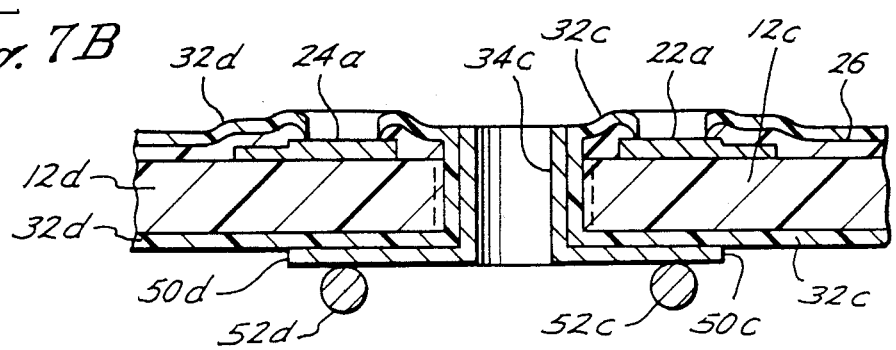

As best seen in FIGS. 7A and 7B, the insulating material 32 is removed from the top of the bonding pads such as by patterning with photoresist and reactive ion etching or wet chemical etching. If insulating layer 32 comprises different materials, such as silicon oxide and silicon nitride, then different etchants may be required. However, silicon oxide and silicon nitride can be removed in a single dry plasma etch despite their different etch rates. As an alternative, the insulating layer 32 may be placed over the wafer 10 in the step of FIGS. 6A and 6B leaving the top of the pads bare, but it is preferable to use the step shown in FIGS. 6A and 6B of coating the entire wafer with the insulating layer 32 and then removing it from the pads, as shown in FIGS. 7A and 7B, for ease of manufacture. After the inside of the holes have been insulated an electrically conductive layer 34, such as copper, gold, or aluminum, shown as 34c and 34d for dies 12c and 12d respectively, is placed around the inner periphery of but not filling the insulating material 32 in the holes, for instance by pattern electroplating. preferred thickness of electrically conductive layer 34 is 1-10 microns.

Referring further to FIG. 7B, if desired, backside electrical conductors 50, shown as 50c and 50d for dies 12c and 12d respectively, can be applied to the bottom of insulating layer 32 in a separate step. It is necessary to apply insulating layer 32 between wafer 10 and conductors 50 in order to prevent conductors 50 from short-circuiting wafer 10. Conductors 50 are electrically connected to electrically conductive layer 34, so pads 22a and 24a can be electrically interconnected to conductors 50c and 50d, respectively, beneath wafer 10. Conductors 50 can be patterned by numerous methods known to those having skill in the art, such as electroplating, electroless plating, laser direct write, or chemical vapor deposition. A suitable pattern, for instance, would be an array with conductors 50 properly spaced for alignment with a die and/or substrate to be mounted on. A preferred thickness of backside conductors 50 is 1-10 microns. To facilitate interconnection to another die or substrate, bumps 52, shown as 52c and 52d, can be deposited on conductors 50c and 50d respectively. Bumps 52 can, for example, be formed of solder, gold, tin-lead alloys, or electrically conductive adhesives. Solder and tin-lead alloys would be advantageous in reflowable bonding operations. A preferred size for bumps 52 is 0.5-2.0 mils. There are several well known methods for patterning bumps on conductors; see, for example, P. A. Totta and R. P. Sopher, "SLT Device Metallurgy and its Monolighic Extension," *IBM Journal of Research Developement*, pp. 226-238 (1968); K. Hatada, H. Fujimoto and K. Matsunaga, "New Film Carrier Assembly Technology: Transferred Bumps TAB," *IEEE Transactions on Components, Hybrids, and Manufacturing Technology*, Vol. CHMT-10, No. 3

(1987); and U.S. Pat. No. 3,303,393 entitled "Terminals For Microminiaturized Devices and Methods of Connecting Same to Circuit Panels," which issued in Feb. 1967. In any event, it is understood that the presence of bumps is not essential to dies manufactured in accordance with the present invention, since the bumps or other means of electrical interconnection can instead be attached to the component that the die will be interconnected and stacked. In another embodiment, backside conductors 50 can be applied after electrically conductive connections 36a–36f are added, as long as backside conductors 50 are electrically connected to conductors 34, 36, or both.

Figure 8B:
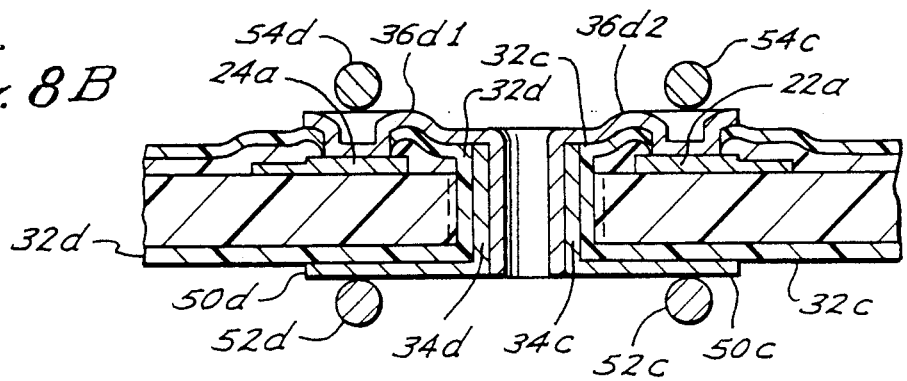

Referring now to FIGS. 8A, 8B and 9, an electrically conductive connection 36a, 36b, 36c, 36d, 36e, and 36f is added between the top of each pad, such as copper, gold, or aluminum, by a process such as pattern electroplating or sputter deposition followed by resist patterning and wet etch, to the layer 34 in an adjacent hole. If desired, the step of FIGS. 7A and 7B of adding the layer 34 may be omitted and combined with the step of FIGS. 8A and 8B of adding the electrical interconnection between the interior of the hole and the pad. Electrical conductive connection 36d is shown as connection 36d1 connecting pad 24a to conductor 34d in hole 30d as well as backside conductor 50d, if any. Likewise, connection 36d2 connects pad 22a to conductor 34c in hole 30d as well as backside conductor 50c, if any. Similarly, the other electrically conductive connections 36a, 36b, 36c, 36e, and 36f join preferably two pads to the interior of a single hole, as well as any backside conductors 50. In yet another embodiment, if desired, bumps 54 shown as 54c and 54d can be deposited on pads 22a and 24a respectively, with or without the presence of bumps 52.

As best seen in FIG. 9, cut lines 38 and 40 are illustrated in dotted outline coaxially along the scribe lines 14 and 16 (not numbered). A normal separation operation, such as conventional sawing, is used for separating the individual dies 12 in the wafer 10. It is to be noted that the separation occurs along lines 38 and 40 which extend through the holes between the dies. The result of separating the dies from each other is shown in FIG. 10 in which each of the dies is covered with an insulating layer 32 and having an electrical conductive connection from each of the pads extending to the edge of the die into the holes which have been cut and are provided with an electrical connection on the inside of the cut hole and any backside conductors 50.

As best seen in FIG. 11, a die such as die 12d may now be connected to any suitable substrate such as a silicon substrate 42, having a pad 44 which is connected to one of the connections on the die 12d by soldering 45 between the pad 44 and the electrical connection 36d.

Figure 12:
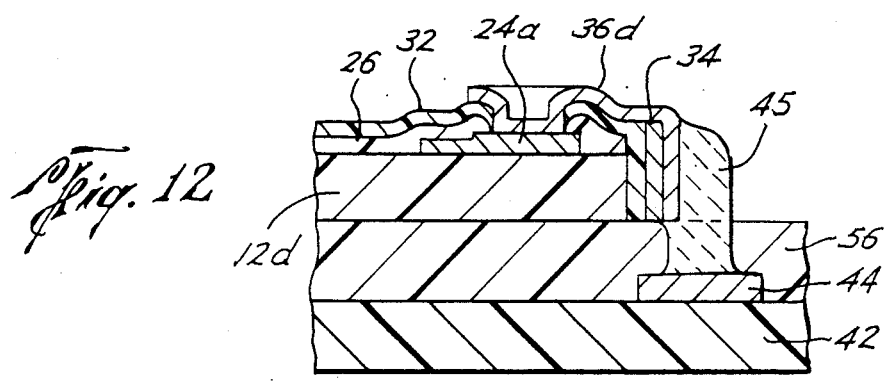
FIG. 12 is a cross-section similar to FIG. 11 in which a dielectric layer is added between the die and a substrate.

Referring now to FIG. 12, though not essential to the present invention, preferably a dielectric layer 56 is placed between die 12d and substrate 42. Dielectric 56 can provide mechanical as well as corrosive protection to the underlying metallization. A preferred dielectric is polyimide, however teflon is also suitable. A polyimide coating 56 can be applied after die 12d and substrate 42 are soldered together. Alternatively, polyimide 56 can be placed over die 12d or substrate 42 and then selectively laser drilled to open holes where electrical interconnection is required.

The present invention thereby provides an inexpensive integrated circuit which can be easily surface mounted directly to a substrate and which could also be extended for assembling stacks or 3-D arrays of devices as well as providing an integrated circuit that is very reliable in terms of corrosion resistance.

Figure 13:
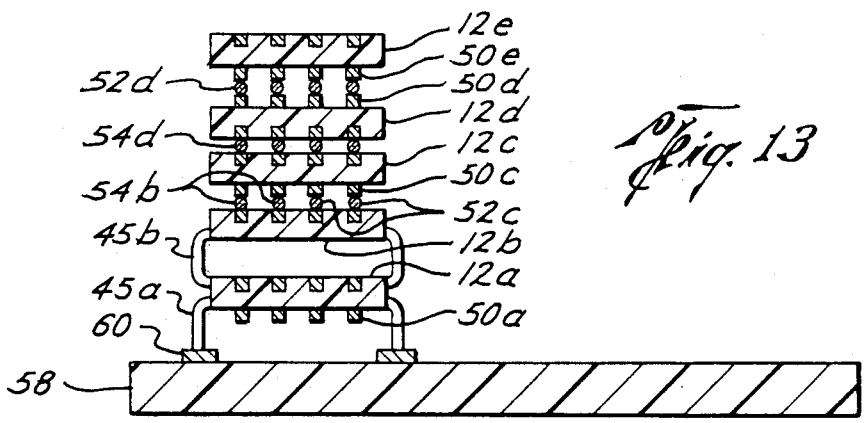
FIG. 13 is a cross-sectional view of a particular stacking arrangment of dies that can be assembled in accordance with the present invention.
Figure 14:
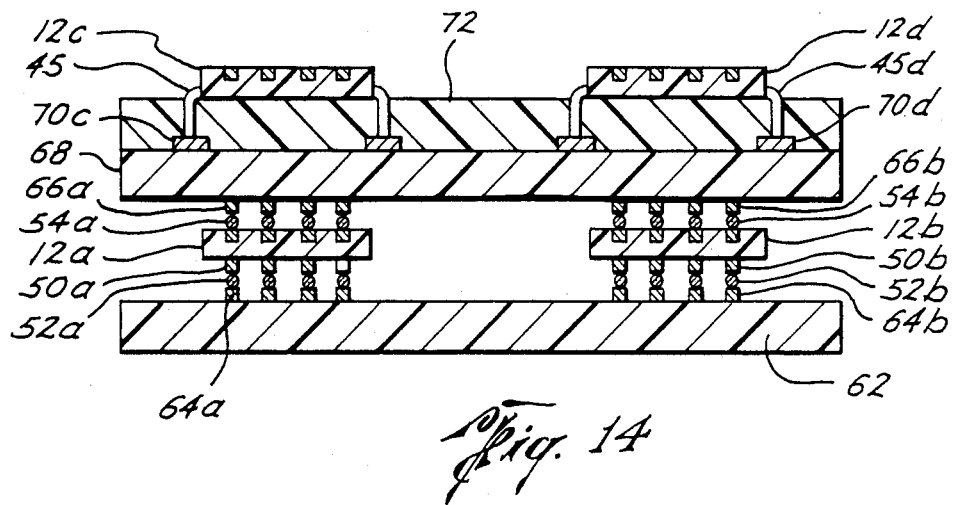
FIG. 14 is a cross-sectional view similar to FIG. 13 showing another stacking arrangement of dies.

FIGS. 13 and 14 show, for illustration purposes only, various stacking arrangements of dies that can be assembled in accordance with the present invention. FIG. 13 shows die 12a mounted to a substrate 58 by connections 45a between the inside of the cut holes on die 12a and pads 60 on substrate 58, die 12b stacked on die 12a by connections 45b between the inside of cut holes of dies 12a and 12b, die 12c stacked on die 12b by bump connections 54b and 52c between the pads on die 12b and the backside conductors 50c on die 12c, die 12d flipped over and stacked on die 12c by bump connections 54d between the pads on die 12c and the pads on die 12d, and die 12e stacked on die 12d by interconnecting backside conductors 50e and 50d with bumps 52d. It is understood that the bumps between dies 12b and 12c could initially be attached to the lower die 12b, such as bumps 54b, or the upper die 12c, such as bumps 52c. Also, dies that will not have backside interconnections such as die 12a may or may not include backside conductors 50a. Likewise, FIG. 14 showns dies 12a and 12b connected to a first substrate 62 by connection bumps 52a and 52b between substrate pads 64a and 64b and backside conductors 50a and 50b respectively. Dies 12a and 12b are further connected to pads 66a and 66b on a second substrate 68 by bumps 54a and 54b respectively. Dies 12c and 12d are connected to pads 70c and 70d on the opposite side of substrate 68 by electrical interconnections 45c and 45d extending to the conductors on the inside of their respective cut holes, wherein the conductors are electrically connected to pads on dies 12c and 12d as previously described. Additionally, polyimide layer 72 can be coated between substrate 68 and dies 12c and 12d.

The present invention, therefore, is well adapted to carry out the objects and attain the ends and advantages mentioned as well as others inherent therein. While a presently preferred embodiment of the invention has been given for the purpose of disclosure, numerous changes in the details of construction, arrangement of parts, and steps of the process, will be readily apparent to those skilled in the art and which are encompassed within the spirit of the invention and the scope of the appended claims.

What is claimed is:

1. A method for assembling a stack of integrated circuit dies, comprising:
    making holes through a wafer having a plurality of integrated circuit dies in which the dies include pads thereon connected to integrated circuits in the dies, said holes being placed between the dies and adjacent the pads;
    placing a layer of insulating material over the wafer and in the outer periphery of the holes;
    adding an electrically conductive connection between the top of each pad and the inside of the insulating material in an adjacent hole;
    separating the plurality of dies from each other along lines extending through the holes between the dies; and
    connecting a plurality of dies by an electrical interconnection between the electrically conductive connections on the inside of the cut holes of the dies.

2. The method of claim 1 further including connecting a die to a substrate by an electrical interconnection to the electrically conductive connection on the inside of the cut holes of the die.

3. The method of claim 1 wherein the holes are placed between pads on adjacent dies.

4. The method of claim 1 wherein scribe lines are positioned on the wafer between adjacent dies and the holes are placed on the scribe lines.

5. The method of claim 1 further including adding a dielectric layer between the top of a lower die and the bottom of an adjacent upper die after the dies are electrically interconnected.

6. A method of assembling a stack of integrated circuit dies, comprising:
   making holes through a wafer having a plurality of integrated circuit dies in which the dies include pads thereon connected to integrated circuits in the dies, said holes being placed between the dies and adjacent the pads;
   placing a layer of insulating material over the wafer and in the outer periphery of the holes;
   removing the insulating material from the top of the pads;
   adding an electrically conductive connection between the top of each pad and the inside of the insulating material in said adjacent hole;
   separating the plurality of dies from each other along lines passing through holes between the dies; and
   connecting a plurality of dies by an electrical interconnection between the electrically conductive connections on the inside of the cut holes of the dies.

7. A method for assembling a stack of integrated circuit dies, comprising:
   making holes through a wafer having a plurality of integrated circuit dies in which the dies include pads thereon connected to integrated circuits in the dies, said holes being placed between the dies and adjacent the pads;
   placing a layer of insulating material over the wafer, in the outer periphery of the holes, and beneath the wafer along its backside;
   adding an electrically conductive connection between the top of each pad, the inside of the insulating material in an adjacent hole, and the bottom of the insulating layer beneath the wafer so that the pads are electrically interconnected to conductors beneath the wafer; and
   separating the plurality of dies from each other along lines extending through the holes between the dies.

8. The method of claim 7 wherein the holes are placed between pads on adjacent dies.

9. The method of claim 7 wherein scribe lines are positioned on the wafer between adjacent dies and the holes are placed on the scribe lines.

10. The method of claim 7 further including connecting a plurality of dies by an electrical interconnection between the electrically conductive connections on the inside of the cut holes of the dies.

11. The method of claim 7 further including connecting a die to a substrate by an electrical interconnection to the electrically conductive connection on the bottom of the die.

12. The method of claim 7 further including connecting a plurality of dies by an electrical interconnection between the pads on the top of a first die and the conductors on the bottom of a second die.

13. The method of claim 12 further including adding a dielectric layer between the top of a first die and the bottom of an adjacent second die after the dies are electrically interconnected.

14. The method of claim 12 further including connecting electrically conductive bumps to the pads on the top of a die.

15. The method of claim 12 further including connecting electrically conductive bumps to the conductors on the bottom of a die.

16. The method of claim 15 wherein the electrically conductive bumps form an array pattern.

17. The method of claim 15 wherein the electrically conductive bumps are metals selected from the group consisting of solder, gold, and tin-lead alloys.

18. The method of claim 15 wherein the electrically conductive bumps are electrically conductive adhesives.

19. A method of assembling a stack of integrated circuit dies, comprising:
   making holes through a wafer having a plurality of integrated circuit dies in which the dies include pads thereon connected to integrated circuits in the dies, said holes being placed between the dies and adjacent the pads;
   placing a layer of insulating material over the wafer, in the outer periphery of the holes, and beneath the wafer;
   removing the insulating material from the top of the pads;
   adding an electrically conductive connection between the top of each pad, the inside of the insulating material in an adjacent hole, and the bottom of the insulating layer beneath the wafer so that the pads are electrically interconnected to conductors beneath the wafer; and
   separating the plurality of dies from each other along lines passing through holes between the dies.

20. The method of claim 19 further including connecting a plurality of dies by an electrical interconnection between the pads on the top of a first die and the conductors on the bottom of a second die.

* * * * *

UNITED STATES PATENT OFFICE
CERTIFICATE OF CORRECTION

Patent No. 4,984,358    Dated  Jan. 15, 1991

Inventor(s)  B. Nelson

It is certified that error appears in the above-identified patent and that said Letters Patent is hereby corrected as shown below:

Column 2, line 19, change "car" to -- can --.

Column 2, line 60, delete "," after "between".

Column 4, line 34, insert -- A -- after "electroplating.".

Signed and Sealed this

Twenty-ninth Day of September, 1992

Attest:

DOUGLAS B. COMER

*Attesting Officer*    Acting Commissioner of Patents and Trademarks